US007181677B1

(12) United States Patent
Weng

(10) Patent No.: US 7,181,677 B1
(45) Date of Patent: Feb. 20, 2007

(54) SYSTEM AND METHOD FOR PRODUCING DATA AND ECC CODE WORDS USING A HIGH RATE RESTRICTED-SYMBOL CODE

(75) Inventor: Lih-Jyh Weng, Shrewsbury, MA (US)

(73) Assignee: Maxtor Corporation, Scotts Valley, CA (US)

( * ) Notice: Subject to any disclaimer, the term of this patent is extended or adjusted under 35 U.S.C. 154(b) by 580 days.

(21) Appl. No.: 10/465,266

(22) Filed: Jun. 19, 2003

Related U.S. Application Data

(60) Provisional application No. 60/446,212, filed on Feb. 10, 2003.

(51) Int. Cl.
*H03M 13/00* (2006.01)
(52) U.S. Cl. .................................... 714/784
(58) Field of Classification Search ............... 714/785
See application file for complete search history.

(56) References Cited

U.S. PATENT DOCUMENTS

| | | | | |
|---|---|---|---|---|
| 4,856,003 A * | 8/1989 | Weng | .................. | 714/784 |
| 5,003,539 A * | 3/1991 | Takemoto et al. | .......... | 714/785 |
| 5,136,592 A * | 8/1992 | Weng | .................. | 714/762 |
| 5,822,336 A * | 10/1998 | Weng et al. | ................ | 714/784 |
| 6,081,210 A * | 6/2000 | Nikolic et al. | ................ | 341/59 |
| 6,751,276 B1 * | 6/2004 | Okada et al. | ............... | 375/350 |
| 6,772,390 B2 * | 8/2004 | Weng et al. | ................ | 714/785 |
| 6,895,546 B2 * | 5/2005 | Ivry | .......................... | 714/784 |
| 2001/0007578 A1 * | 7/2001 | Ran et al. | ................... | 375/253 |

* cited by examiner

*Primary Examiner*—Albert Decady
*Assistant Examiner*—Sam Rizk
(74) *Attorney, Agent, or Firm*—Patricia A. Sheehan

(57) ABSTRACT

An encoding system manipulates L m-bit data symbols or sequences in accordance with a "restricted-symbol" code to produce code words that include error correction code (ECC) redundancy information and also meet modulation requirements, such as run length. The system combines the data and associated redundancy information of a code word D of the underlying code and one or more predetermined symbols or sequences that are appended to the data code word with the corresponding symbols or bit sequences of a selected code word F, to produce a transmission code word C that consists of symbols or sequences that meet the modulation requirements. Thereafter, the system corrects any errors in the retrieved or received code word C using the included redundancy information and the L m-bit data symbols or sequences are then recovered by removing therefrom the contributions of the code word F. The system may instead use the restricted-symbol code strictly as a data code, by combining the respective m-bit data symbols or sequences and one or more predetermined symbols with one or more selected m-bit symbols or sequences, to produce L+1 m-bit symbols or sequences that meet the modulation requirements. The predetermined symbols or sequences are appended to the data to aid in decoding, with the corresponding symbols in the encoded code word or data symbols or sequences indicating to a decoder which selected code word, symbols or sequences have been combined with the data.

12 Claims, 3 Drawing Sheets

$$G = \begin{bmatrix} 1000 & 0000 & 0000 & 0000 & 0000 & 0001 & 1101 \\ 0100 & 0000 & 0000 & 0000 & 0000 & 0011 & 1010 \\ 0010 & 0000 & 0000 & 0000 & 0000 & 0111 & 0100 \\ 0001 & 0000 & 0000 & 0000 & 0000 & 1110 & 1000 \\ 0000 & 1000 & 0000 & 0000 & 0000 & 1100 & 1101 \\ 0000 & 0100 & 0000 & 0000 & 0000 & 1000 & 0111 \\ 0000 & 0010 & 0000 & 0000 & 0000 & 0001 & 0011 \\ 0000 & 0001 & 0000 & 0000 & 0000 & 0010 & 0110 \\ 0000 & 0000 & 1000 & 0000 & 0000 & 0100 & 1100 \\ 0000 & 0000 & 0100 & 0000 & 0000 & 1001 & 1000 \\ 0000 & 0000 & 0010 & 0000 & 0000 & 0010 & 1101 \\ 0000 & 0000 & 0001 & 0000 & 0000 & 0101 & 1010 \\ 0000 & 0000 & 0000 & 1000 & 0000 & 1011 & 0100 \\ 0000 & 0000 & 0000 & 0100 & 0000 & 0111 & 0101 \\ 0000 & 0000 & 0000 & 0010 & 0000 & 1110 & 1010 \\ 0000 & 0000 & 0000 & 0001 & 0000 & 1100 & 1001 \\ 0000 & 0000 & 0000 & 0000 & 1000 & 1000 & 1111 \\ 0000 & 0000 & 0000 & 0000 & 0100 & 0000 & 0011 \\ 0000 & 0000 & 0000 & 0000 & 0010 & 0000 & 0110 \\ 0000 & 0000 & 0000 & 0000 & 0001 & 0000 & 1100 \end{bmatrix}$$

$$G' = \begin{bmatrix} 1000 & 1000 & 1000 & 1000 & 1000 & 1010 & 0111 \\ 0100 & 0100 & 0100 & 0100 & 0100 & 0101 & 0011 \\ 0010 & 0010 & 0010 & 0010 & 0010 & 1010 & 0110 \\ 0001 & 0001 & 0001 & 0001 & 0001 & 0101 & 0001 \end{bmatrix}$$

rank r        4    4    4    4    4    2    3

$2^{(m-r)}$    1    1    1    1    1    4    2    sum = 11

$$G = \begin{bmatrix}
1000 & 0000 & 0000 & 0000 & 0000 & 0001 & 1101 \\
0100 & 0000 & 0000 & 0000 & 0000 & 0011 & 1010 \\
0010 & 0000 & 0000 & 0000 & 0000 & 0111 & 0100 \\
0001 & 0000 & 0000 & 0000 & 0000 & 1110 & 1000 \\
0000 & 1000 & 0000 & 0000 & 0000 & 1100 & 1101 \\
0000 & 0100 & 0000 & 0000 & 0000 & 1000 & 0111 \\
0000 & 0010 & 0000 & 0000 & 0000 & 0001 & 0011 \\
0000 & 0001 & 0000 & 0000 & 0000 & 0010 & 0110 \\
0000 & 0000 & 1000 & 0000 & 0000 & 0100 & 1100 \\
0000 & 0000 & 0100 & 0000 & 0000 & 1001 & 1000 \\
0000 & 0000 & 0010 & 0000 & 0000 & 0010 & 1101 \\
0000 & 0000 & 0001 & 0000 & 0000 & 0101 & 1010 \\
0000 & 0000 & 0000 & 1000 & 0000 & 1011 & 0100 \\
0000 & 0000 & 0000 & 0100 & 0000 & 0111 & 0101 \\
0000 & 0000 & 0000 & 0010 & 0000 & 1110 & 1010 \\
0000 & 0000 & 0000 & 0001 & 0000 & 1100 & 1001 \\
0000 & 0000 & 0000 & 0000 & 1000 & 1000 & 1111 \\
0000 & 0000 & 0000 & 0000 & 0100 & 0000 & 0011 \\
0000 & 0000 & 0000 & 0000 & 0010 & 0000 & 0110 \\
0000 & 0000 & 0000 & 0000 & 0001 & 0000 & 1100
\end{bmatrix}$$

$$G' = \begin{bmatrix}
1000 & 1000 & 1000 & 1000 & 1000 & 1010 & 0111 \\
0100 & 0100 & 0100 & 0100 & 0100 & 0101 & 0011 \\
0010 & 0010 & 0010 & 0010 & 0010 & 1010 & 0110 \\
0001 & 0001 & 0001 & 0001 & 0001 & 0101 & 0001
\end{bmatrix}$$

| rank r       | 4 | 4 | 4 | 4 | 4 | 2 | 3 |              |
|--------------|---|---|---|---|---|---|---|--------------|
| $2^{(m-r)}$  | 1 | 1 | 1 | 1 | 1 | 4 | 2 | sum = 11     |

FIG. 3

SYSTEM AND METHOD FOR PRODUCING DATA AND ECC CODE WORDS USING A HIGH RATE RESTRICTED-SYMBOL CODE

CROSS-REFERENCE TO RELATED APPLICATION

The present application claims the benefit of U.S. Provisional patent application Ser. No. 60/446,212, which was filed on Feb. 10, 2003, by Lih Weng for MODULATED LINEAR CODES AND REED-SOLOMON CODES WITH RESTRICTED SYMBOLS and is hereby incorporated by reference.

BACKGROUND OF THE INVENTION

1. Field of the Invention

This invention relates generally to data processing systems and, in particular, to systems that encode data for error correction and modulation purposes.

2. Background Information

Before data are transmitted over a communications channel to a receiver or a data storage device, the data are typically encoded twice, once to allow error detection and/or correction and then again for signal modulation purposes. The error correction/detection encoding manipulates the data in accordance with a distance d error correction code (ECC), to produce data code words that include the data and associated redundancy information. The modulation encoding encodes sequences of data and redundancy information into longer modulation code sequences that meet desired run lengths and so forth. The modulation encoding promotes recovery of the respective bits and/or symbols that comprise the data and redundancy information from the transmitted or stored signals essentially by ensuring that transitions between various signal levels occur at least every predetermined numbers of bits.

To decode the data and associated redundancy information from received or retrieved signals, the decoder uses the modulation code to recover the bit sequences. The system then groups the bits into symbols or sequences of appropriate lengths, to reproduce the data code words. The system next decodes the data code words using the ECC to produce, if possible, error-free data.

The modulation code decoding includes in the decoded bit sequences errors induced by the communications channel, over which the bit sequences are transmitted to and from storage media or to a receiver. The decoding itself also introduces further errors associated with the misinterpretation of the bits of the various modulation code sequences. The errors introduced into the bit sequences by the decoding process are commonly referred to as "propagation errors." The propagation errors may affect multiple symbols that are included in the same or in multiple data code words, which may, in turn, result in uncorrectable errors in the data. Accordingly, more powerful error correction is required to protect against the propagation errors. The system must thus include more redundancy in the transmitted or stored information, and consequently fewer data symbols may be transmitted within a given time and/or stored within a given space. Further, the system must be made more complex to operate with the more powerful error correction codes and/or techniques.

SUMMARY OF THE INVENTION

The invention is a system for manipulating data in accordance with a rate $L/(L+1)$ "restricted-symbol" linear code to produce code words that include error correction code (ECC) redundancy information and also meet modulation requirements, such as run length. The system eliminates the need for a separate data modulation code, and thus, eliminates the source of the propagation errors. For ease of understanding, the invention is explained in terms of linear codes that are based on multiple bit symbols. However, as discussed further herein, the invention also includes linear codes that are based on bit sequences and/or non-binary linear codes.

Basically, the current system produces a transmission code word C with m-bit symbols or bit sequences that meet the modulation requirements by combining the data and associated redundancy information of a code word D of the underlying linear code with the corresponding symbols or bit sequences of a selected code word F. The transmission code word C thus consists of only the non-prohibited symbols, that is, of symbols that are not prohibited by the modulation rules. Thereafter, the retrieved or received code word C is decoded using the linear code to first correct any errors introduced by the communications channel, and then the data are recovered by removing therefrom the contributions of the code word F.

As discussed below, the system may instead be used to manipulate data that is not part of an ECC code word. The system may thus use the linear code as strictly a data code, that is, encode data sequences or symbols to meet the modulation requirements, as discussed below.

BRIEF DESCRIPTION OF THE DRAWINGS

The invention description below refers to the accompanying drawings, of which:

FIG. 3 illustrates various matrices associated with the operations of the system.

DETAILED DESCRIPTION OF AN ILLUSTRATIVE EMBODIMENT

Before discussing the system operations in general, the system and its operations are discussed by way of examples using binary codes. The same techniques may also be readily used, with some modification, with non-binary codes.

In Section A, the system and its operations are described using as an example a data code that combines data and selected symbols in bit-by-bit XOR operations. In Sections B and C the system and its operations are described using codes over $GF(2^m)$, with Section C describing the use of a Reed Solomon error correction code. Section D describes in more detail certain operations of a general system that operates in accordance with the system discussed in section B.

The examples included herein are based on modulation requirements that prohibit m-bit sequences or symbols that consist of all zeros or all ones. Other modulation requirements may be used in addition or otherwise, such as prohibiting symbols that consist of patterns of 0101 . . . or 1010 . . . , and so forth.

Section A

Figure 1:
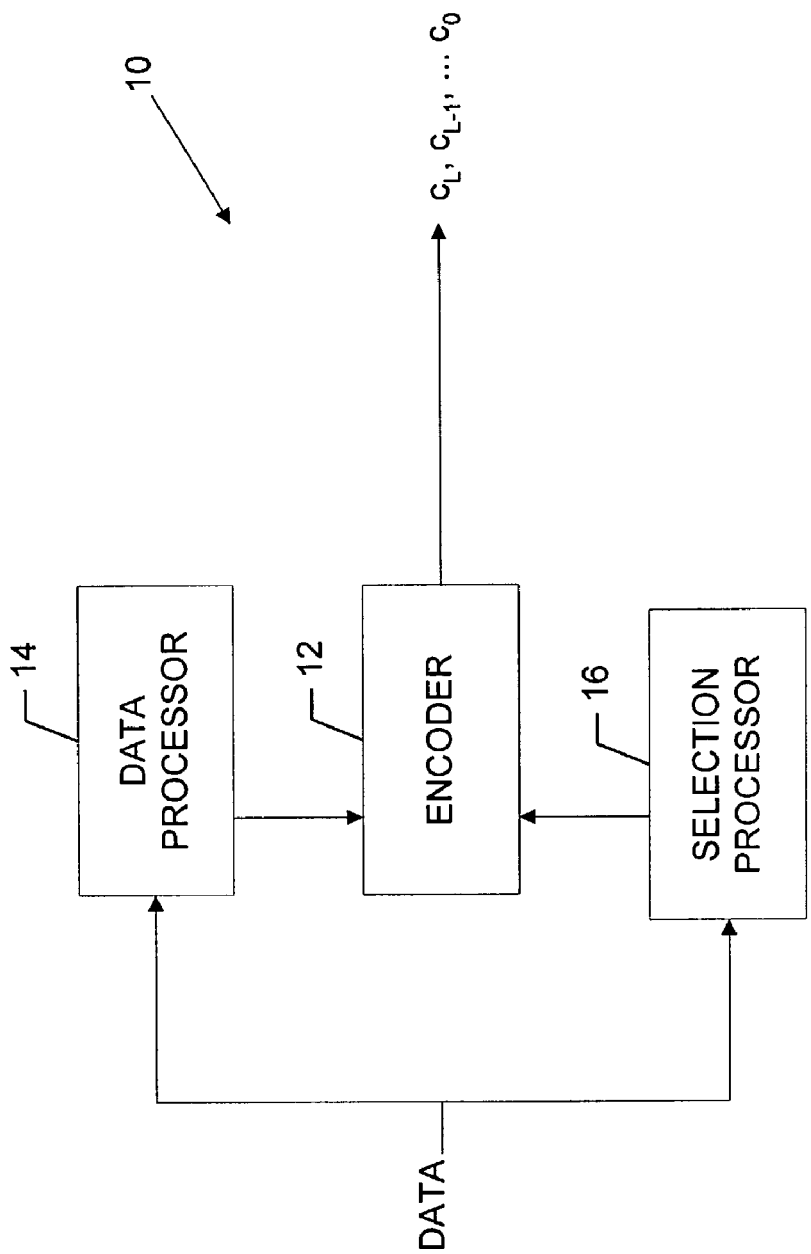
FIG. 1 is a functional block diagram of a system constructed in accordance with the invention.

Referring now to FIG. 1, an encoding system 10 operates in accordance with a high-rate data code that uses m-bit symbols. A bit-by-bit XOR operation is defined to combine two m-bit symbols. An encoder 12 encodes L data symbols $d_j$ to produce L+1 symbols that meet the modulation requirements. The encoder 12 consists of one or more XOR gates (not shown) that combine the data symbols with L+1 selected symbols.

Before combining the L data symbols with the selected symbols, a data processor 14 appends a predetermined symbol $d_L$ to the data symbols, to produce a sequence of L+1 symbols $d_j$, for j=0, 1, . . . L. The encoder 12 then combines the L+1 symbols with L+1 symbols selected by a selection processor 16, to produce an L+1 m-bit symbol sequence in which the respective symbols $c_j$ meet the modulation requirements. The operations of the selection processor are discussed in more detail below by way of an example.

In the example, m=4 and the prohibited symbols are the all zero symbol [0000] and the all one symbol [1111]. The selection processor 16 determines, for the respective symbols $d_j$, the various m-bit symbols that when combined therewith produce the prohibited values. For a given symbol $d_j$, the selection processor thus determines which symbols combine with $d_j$ to produce [0000] and [1111]. Thereafter, the selection processor selects from the remaining 4-bit symbols a particular symbol $c_L$ that can be combined with each of the symbols $d_j$ such that the respective symbols $$c_j = c_L + d_j \text{ for } j=0, 1, \ldots L$$

meet the modulation requirements. As discussed in more detail below, for ease of decoding, the appended symbol $d_L$ is preferably selected as the all-zero symbol. The combination operation can also be though of as a matrix operation $$(c_L, c_{L-1} \ldots c_1, c_0) = (0, d_{L-1}, d_{L-2} \ldots d_1, d_0) \oplus (c_L, c_L \ldots c_L),$$

where $d_L$ is shown as the all zero symbol.

More specifically, the selection processor 16 determines first that $c_L$ cannot assume the values [0000] and [1111], since the appended symbol $d_L$ is the all-zero symbol and $c_L + 0 = c_L$. In this example, the all zero symbol is included in the $L^{th}$ position in the sequence of data symbols, however, the all-zero symbol may instead be included in any predetermined location in the sequence. The processor also determines that $c_L$ cannot assume any value which produces a combination $d_j + c_L$ equal to either [0000] or [1111], for each of the other value of $d_j$. The system then selects $c_L$ as one of the remaining 4-bit values, and the encoder 12 combines each of the symbols $d_j$ with the selected symbol $c_L$. The inclusion of $c_L$ as a symbol in a predetermined location within the L+1 symbol sequence $c_j$ facilitates decoding, as discussed below.

There are a maximum of bL values that cannot be used for $c_L$, where b is the number of prohibited symbols, or in the example, b=2. An m-bit symbol can assume $2^m$ values. Accordingly, for a rate L/(L+1) code to exist for all possible m-bit symbols the following must be satisfied:

$$bL < 2^m - b$$

dividing by b gives $$L < (2^m/b) - 1.$$

The value of L must be strictly less than $(2^m/b)-1$ and thus if b is a power of 2, i.e., $b=2^s$, the maximum value for L is $$L_{max} = 2^{m-s} - 2.$$

If b is not a power of 2, $$L = \text{floor } (2^m/b) - 1,$$

where the function floor(y) is defined as the largest integer smaller than y. For any value of b, the maximum value of L is thus $$L_{max} = \text{ceiling}(2^m/b) = 2,$$

where the function ceiling(y) is defined as the smallest integer greater than or equal to y. The best code rate R is then:

$$R = \left\lceil \frac{\text{ceiling}\left(\frac{2^m}{b} - 2\right)}{\text{ceiling}\left(\frac{2^m}{b} - 1\right)} \right\rceil$$

In the example, m=4 and there are two prohibited symbols. Therefore, $$L_{max} = (2^{4-1}) - 2 = 6$$

and the best code rate is $$\frac{6}{7}.$$

The system thus combines respective sequences of six data symbols with selected symbols $c_L$ to produce corresponding 7-symbol sequences that meet the modulation requirements.

In the example the six data symbols $d_5, d_4 \ldots d_0$ are:

[0000],[0001],[0010],[0011],[0100],[0101]

and an all-zero symbol is appended as $d_6$ to produce

[0000],[0000],[0001],[0010],[0011],[0100],[0101].

The prohibited values of $c_L$ for the respective symbols $d_j$ satisfy $$c_L + d_j \neq [0000] \text{ and } c_L + d_j \neq [1111]$$

or for $d_6$=[0000], $c_L$ cannot be [0000] or [1111]

for $d_5$=[0000], $c_L$ cannot be [0000] or [1111]

for $d_4$=[0001], $c_L$ cannot be [0001] or [1110]

for $d_3$=[0010], $c_L$ cannot be [0010] or [1101]

for $d_2$=[0011], $c_L$ cannot be [0011] or [1100]

for $d_1$=[0100], $c_L$ cannot be [0100] or [1011]

for $d_0$=[0101], $c_L$ cannot be [0101] or [1010]

There are thus 12 values that $c_L$ cannot assume, and the 16−12=4 values $c_L$ can assume are:

[0111],[1000],[0110],[1001]

The selection processor 16 selects one of these 4 remaining values as $c_L$. In the example, the processor selects [1000], and the L+1 encoded symbols are $c_L + d_j$ for j=0,1, . . . L, or:

[1000],[1000],[1001],[1010],[1011],[1100],[1101].

To recover the data, the selected symbol $c_L$ is removed from the corresponding symbols $c_j$. Thus, $d_j=c_j+c_L$ for $j=0, 1, \ldots, 5$, where $c_L=c_6$. The corresponding decoder consists of one or more XOR gates (not shown).

Section B

A second approach to the high code rate encoding may be used in conjunction with data codes over $GF(2^m)$. The operations of Galois Field addition and Galois Field multiplication are defined over the field as, respectively, bit-by-bit XOR'ing of two Galois Field elements and polynomial multiplication of two elements modulo the associated primitive polynomial, where the elements are treated as degree m-1 polynomials.

For m=4, the Galois Field elements are treated as degree three polynomials and multiplication is modulo the primitive polynomial $x^4+x+1$. The Galois Field elements of $GF(2^m)$ may be written as powers of a primitive element $\alpha$ and/or as 4-bit symbols. For example, the symbol [0001] is $\alpha^0$, the symbol [0010] is $\alpha^1$ and so forth. The symbols of $GF(2^4)$ are thus:

$0=[0000], \alpha^0=[0001], \alpha^1=[0010], \alpha^2=[0100], \alpha^3=[1000], \alpha^4=[0011], \alpha^5=[0110],$ $\alpha^6=[1100], \alpha^7=[1011], \alpha^8=[0101], \alpha^9=[1010], \alpha^{10}=[0111], \alpha^{11}=[1110], \alpha^{12}=[1111],$ $\alpha^{13}=[1101], \alpha^{14}=[1001]$ With both addition and multiplication defined over the Galois Field, the high rate code encoding uses a fixed sequence of non-zero symbols $f_j$ and a selected Galois Field element $c_L$ such that the L+1 symbol encoded sequence is $c_j=c_L*f_j+d_j$ for $j=0,1 \ldots L$, with an all zero symbol appended as $d_L$. The combining of the symbols $d_j$ with the corresponding $f_j$ and $c_L$ may can also be described using matrix operations as:

$(c_L, c_{L-1} \ldots c_1, c_0)=(0, d_{L-1}, \ldots d_1, d_0) \oplus [c_L \otimes (f_L, f_{L-1}, \ldots, f_1, f_0)]$ The symbol $f_L$ may but need not be $\alpha^0$, such that the $L^{th}$ symbol of the encoded sequence is $c_L$. Otherwise, the value of the selected symbol may be calculated by removing $f_L$ from the symbol in the $L^{th}$ position of sequence. The remaining symbols $f_{L-1}, f_{L-2}, \ldots f_0$ may be arbitrarily selected non-zero elements of $GF(2^m)$.

The encoding process selects a value for $c_L$ such that the respective symbols $c_j$ satisfy the modulation requirements. The operations of the system are again explained by way of an example.

Let the symbols $d_j$ be the sequence

[0000], [0111], [0001], [0010], [0011], [0100], [0101]

or $0, \alpha^{10}, \alpha^0, \alpha^1, \alpha^4, \alpha^2, \alpha^8$ which includes the all-zero symbol as $d_L$, and the fixed sequence of symbols $f_j$ be

[0001], [1100], [0001], [0010], [0010], [0100], [0100]

or $\alpha^0, \alpha^6, \alpha^0, \alpha^1, \alpha^1, \alpha^2, \alpha^2$.

The system selects $c_L$ by first determining which values of $c_L$ are prohibited.

For $d_6=[0000]$ and $f_6=[0001]=\alpha^0$: $(c_L \otimes \alpha^0) \oplus [0000] \neq [0000]$ or $c_L \otimes \alpha^0 \neq [0000]$ and $(c_L \otimes \alpha^0) \oplus [1111] \neq [1111]$ or $c_L \otimes \alpha^0 \neq [1111]$. Accordingly, $c_L$ cannot be either [0000] or [1111].

For $d_5=[0111]=\alpha^{10}$ and $f_5=[1100]\alpha^6$: $(c_L \otimes \alpha^6) \oplus [0111] \neq [0000]$ or $\otimes \alpha^6 \neq [0111]=$ and $(c_L \otimes \alpha^6) \oplus [0111] \neq [1111]$ or $(c_L \otimes \alpha^6) \neq [1000]$. Accordingly, $c_L$ cannot be either [0011] or [1111].

For $d_4=[0001]=\alpha^0$ and $f_4=[0001]=\alpha^0$: $(c_L \otimes \alpha^0) \oplus [0001] \neq [0000]$ or $c_L \otimes \alpha^0 \neq [0001]$ and $(c_L \otimes \alpha^0) \oplus [0001] \neq [1111]$ or $c_L \otimes \alpha^0 \neq [1110]$. Accordingly, $c_L$ cannot be either [0001] or [1110].

For $d_3=[0010]=\alpha^1$ and $f_3=[0010]=\alpha^1$: $(c_L \otimes \alpha^1) \oplus [0010] \neq [0000]$ or $c_L \otimes \alpha^1 \neq [0010]$ and $(c_L \otimes \alpha^1) \oplus [0010] \neq [1111]$ or $c_L \otimes \alpha^1 \neq [1102]$. Accordingly, $c_L$ cannot be either [0001] or [1111].

For $d_2=[0011]=\alpha^4$ and $f_2=[0010]=\alpha^1$: $(c_L \otimes \alpha^1) \oplus [0011] \neq [0000]$ or $c_L \otimes \alpha^1 \neq [0011]$ and $(c_L \otimes \alpha^1) \oplus [0011] \neq [1111]$ or $c_L \otimes \alpha^1 \neq [1100]$. Accordingly, $c_L$ cannot be either [1000] or [0110].

For $d_1=[0100]=\alpha^2$ and $f_1=[0100]=\alpha^2$: $(c_L \otimes \alpha^2) \oplus [0100] \neq [0000]$ or $c_L \otimes \alpha^2 \neq [0100]$ and $(c_L \otimes \alpha^2) \oplus [0100] \neq [1111]$ or $c_L \otimes \alpha^2 \neq [1011]$. Accordingly, $c_L$ cannot be either [0001] or [0110].

For $d_0=[0101]-\alpha^8$ and $f_0=[0100]=\alpha^2$: $(c_L \otimes \alpha^2) \oplus [0101] \neq [0000]$ or $c_L \otimes \alpha^2 \neq [0101]$ and $(c_L \otimes \alpha^2) \oplus [0101] \neq [1111]$ or $c_L \otimes \alpha^2 \neq [1010]$. Accordingly, $c_L$ cannot be either [1100] or [1011].

The system then selects $c_L$ from the 16−11=5 remaining symbols $\alpha^2=[0100]\alpha^8[0101]\alpha^9=[1010]\alpha^{10}=[0111]$ and $\alpha^{14}=[1001]$ In the example, the selection processor selects $c_L=\alpha^8$ and $c_6, c_5, c_4, c_3, c_2, c_1, c_0=(0, d_5, d_4, d_3, d_2, d_1, d_0) \otimes [\alpha^8 \otimes (f_6, f_5, f_4, f_3, f_2, f_1, f_0)]$

=[0101], [1110], [0100], [1000], [1001], [0011], [0010]

or $\alpha^8, \alpha^{11}, \alpha^2, \alpha^3, \alpha^{14}, \alpha^4, \alpha^2$

If every $f_j$ is instead equal to $\alpha^0$, the encoding $c_j=c_L*f_j+d_j$ produces the same result of the encoding of section A, since $c_L*f_j=c_L$ for every j.

During decoding, the system recovers the data symbols as $d_j=c_j+(c_L*f_j)$ for $j=0, 1, \ldots, 5$, with $c_6=c_L$.

Section C

If the code is a shortened (n,k) Reed Solomon error correction code (ECC) over $GF(2^m)$, the data symbols are encoded into a code word D of the ECC code and the fixed pattern F is also a code word of the Reed Solomon code. The "information symbols" $f_{n-1}$ to $f_r$ are arbitrarily selected non-zero elements of $GF(2^m)$, with $f_n$ selected as $\alpha^0$ in the example. The symbols $f_{r-1}$ to $f_0$ are the associated n−k−r redundancy symbols. For convenience, all of the information symbols of F may be selected to be $\alpha^0$, such that the fixed code word is:

$$F = \alpha^0, \alpha^0, \ldots, \alpha^0, h_{r-1}, \ldots, h_1, h_0$$

If, however, the code word with all $\alpha^0$ information symbols includes one or more all zero redundancy symbols, the code word F may instead be $$(\alpha^0, \alpha^0, \ldots, \alpha^0, \alpha^0, h_{r-1}, h_{r-2}, h_{r-3}, \ldots, h_1, h_0) + [\alpha^{p*}(0, 0, \ldots 0, g_r, g_{r-1}, g_{r-2}, \ldots, g_2, g_1, g_0)]$$

where $\alpha^p$ is a selected element of $GF(2^m)$ and the $g_j$'s are the coefficients of the ECC generator polynomial:

$$g(x) = g_r x^r + g_{r-1} x^{r-1} + \ldots + g_1 x + g_0.$$

The fixed-symbol code word F is thus $\alpha^{p*}(\alpha^0, \alpha^0 \ldots \alpha^0 h'_r, h'_{r-1} \ldots, h'_0)$ and an $\alpha^p$ exists as long as $r < n\ L_{max}$.

Assuming $n\ L_{max}$, the system produces an $L+1$ symbol transmission code word C by selecting the value $\alpha^p$ as discussed above in Section B and $C = (c_n, c_{n-1}, \ldots, c_1, c_0) = (0, d_{n-1}, \ldots, d_1, d_0) + [\alpha^{p*}(\alpha^0, \alpha^0, \ldots \alpha^0, h'_r, h'_{r-1}, \ldots, h'_1, h'_2)]$ where $d_j$ are the data and redundancy symbols of a code word D.

The decoding system first decodes the transmission code word C in accordance with the ECC, to correct any errors. The system then recovers $d_j$ by determining:

For data symbols $d_{n-1}, d_{n-2}, \ldots, d_{r+1}$, that is, for $j = n-1, n-2, \ldots r+1$ $d_j = c_j + \alpha^p = c_j + c_n$ For the data symbol $j = r$, $d_r = d_r + (\alpha^{p*} h'_r) = c_r + (c_n * h'_r)$, and For the redundancy symbols $d_{r-1}, d_{r-2}, \ldots, d_0$, that is, for $j = r-1, r-2, \ldots, 0$ $d_j = c_j + (\alpha^{p*} h'_j) = c_j + (c_n * h'_j)$.

Assuming now that $n > L_{max}$, two or more fixed symbol code words $F_0, F_1 \ldots F_v$ are required such that $F = F_0 + F_1 + \ldots + F_v$. The code words are selected such that non-zero information symbols of the respective code words $F_i$ correspond to particular segments of the data code word that include $L_{max}$ or fewer symbols.

In the example, $3 * L_{max} > n > 2 * L_{max}$, and three fixed-symbol code words are required. The result is an $n+3$ symbol transmission code word C that includes the values $\alpha^{p0}$, $\alpha^{p1}$, and $\alpha^{p2}$ in predetermined symbol locations. In the example, the fixed-symbol code words $F_2$, $F_1$ and $F_0$ are selected such the code word $F = F_0 + F_1 + F_2$ has $\alpha^0$ in the locations that correspond to $c_{n+2}$, $c_{n+1}$ and $c_n$, to simplify the decoding operations.

The code word manipulation processor appends three all zero symbols to the data code word to produce:

$$(0, 0, 0, d_{n-1}, d_{n-2}, \ldots d_1, d_0)$$

and the code words $F_2$, $F_1$ and $F_0$ are then:

Note that the respective fixed-symbol code words $F_1$ have predetermined ones of the symbols $f_{n+2}$, $f_{n+1}$ and $f_n$ set to $\alpha^0$ and the remaining set to all zeros. Further, the fixed-symbol code words $F_2$ and $F_1$ each have $L_{max}$ predetermined information symbols set to $\alpha^0$ with the remaining information symbols set to all zeros. In particular, $F_2$ includes information symbols $f_{n-1}$ to $f_{n-1-Lmax}$, set to $\alpha^0$ and $F_1$ includes information symbols $f_{n-1-Lmax-2}$ to $f_L$ set to $\alpha^0$. The last r symbols of the code words $F_2$ and $F_1$ are the r redundancy symbols that correspond to the respective code word information symbols. For these code words, the redundancy symbols, may include one or more all zero symbols. The code word $F_0$ has all zeros for the information symbols that correspond to the symbols that are set to $\alpha^0$ in $F_2$ and $F_1$. Further, $F_0$ has the next $L-r-1$ information symbols set to $\alpha^0$ and, as discussed above, the remaining symbols $f_r$ to $f_0$ are the associated redundancy symbols $h'_r$ to $h'_0$. While the redundancy symbols of the code words $F_1$ and $F_2$ may include one or more all-zero symbols, the combinations of the corresponding redundancy symbols of the code words $F_i$ may not include all-zero symbols.

Figure 2:
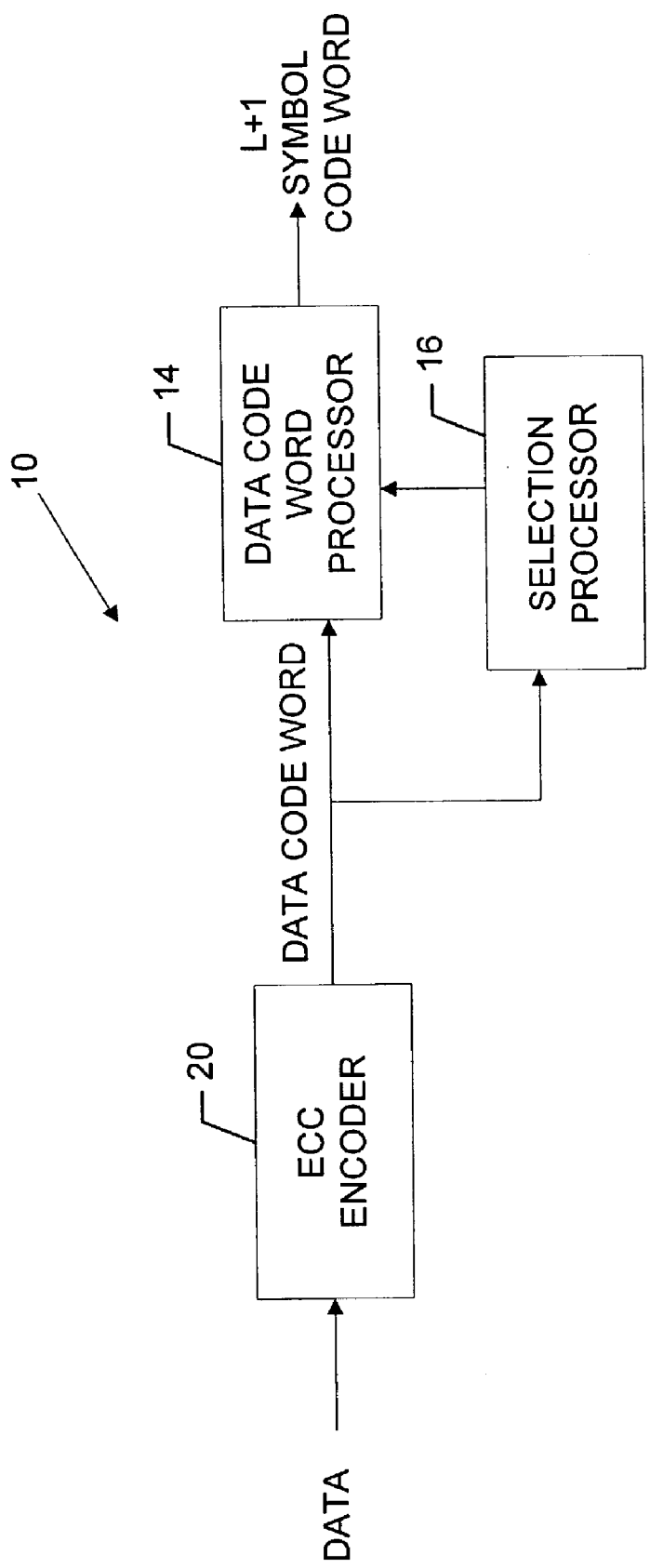
FIG. 2 is a functional block diagram of an alternative system constructed in accordance with the invention.

Referring now to FIG. 2, an ECC encoder 20 encodes the data symbols to produce the data code word D. The selection processor 16 first determines a value of $\alpha^{p2}$ that ensures that the $L_{max}$ information symbols of C that correspond to the $\alpha^0$ information symbols of $F_2$ do not have the prohibited values. In the example, the prohibited values are either all zeros or all ones. Thus, the value of $\alpha^{p2}$ is selected such that the symbols $c_{n-1}$ to $c_{n-1-Lmax}$ do not have the values [0000] or [1111]. Similarly, the selection processor determines a value of $\alpha^{p1}$ such that the next $L_{max}$ symbols of C, that is, the symbols that correspond to the $\alpha^0$ information symbols of $F_1$ do not have the values [0000] or [1111]. Finally, the value of $\alpha^{p0}$ is selected such that the remaining symbols of C, which include the remaining $L-r$ information symbols and the r redundancy symbols do not have values of [0000] or [1111]. The code word F is then $\alpha^{p0} F_0 + \alpha^{p1} F_1 + \alpha^{p2} F_2$.

In matrix notation, the system determines $\alpha^{p1}$ and $\alpha^{p2}$ such that $(t_{n+2}, t_{n+1}, t_n, \ldots t_1, t_1, t_0) =$
$(0,0,0,d_{n-1},d_{n-2},d_{n-3}, \ldots, d_2,d_1,d_0) \oplus [a_{n+2} \otimes (a^0, 0\ 0, a^0, a^0, \ldots, a^0, 0, 0, \ldots, 0,0,0,0,0,0,0,0,h_{r-1},h_{4-2}, h_{r-3}, \ldots, h_2 h_1, h_0)]$ $\oplus [a_{n+1} \otimes (0, a^0, 0, 0, 0, \ldots, 0, 0, a^0, a^0, a^0, \ldots, a^0, 0, 0, 0, 0\ \ldots 0, h'_{r-1}, h'r_{-2}, h'_{r-3}, \ldots, h'_2, h'_1, h'_0)]$ and $t_j \neq [0000]$ or [1111] for $j = n-1, n-2, n-1, n-2 \ldots, n-2*L_{max}$ and $t_j \neq [0000]$ or [1111] for $j = n-1, n-2, n-1, n-2 \ldots, n-2*L_{max}$ The system then determines $\alpha^{p0}$ such that $(t_{n+2}, t_{n+1}, t_n, \ldots t_1, t_1, t_0) = (0,0,0,d_{n-1},d_{n-2},d_{3-3}, \ldots, d_2, d_1, d_0)$

| $\leftarrow$ 3 $\rightarrow$ | $\leftarrow$ Lmax $\rightarrow$ | $\leftarrow$ Lmax $\rightarrow$ | $\leftarrow$ L-r $\rightarrow$ | $\leftarrow$ r $\rightarrow$ |

$(\alpha^0, 0, 0, \alpha^0, \alpha^0, \alpha^0, \ldots, \alpha^0, 0, 0, 0, \ldots 0, 0, 0, 0, 0 \ldots, 0, 0, 0, 0, h_{r-1}, h_{r-2}, h_{r-3}, \ldots, h_2, h_1, h_0)$ $(0, \alpha^0, 0, 0, 0, \ldots, 0, 0, 0, 0, 0, \alpha^0, \alpha^0, \alpha^0, \ldots \alpha^0, 0, 0, 0 \ldots, 0, 0, 0, 0, h''_{r-1}, h''_{r-2}, h''_{r-3}, \ldots, h''_2, h''_1, h''_0)$ $(0, 0, \alpha^0, 0, 0, \ldots, 0, 0, 0, 0, 0, 0, \ldots 0, 0, 0, 0, \alpha^0, \alpha^0, \alpha^0, \ldots, \alpha^0, h'_{r-1}, h'_{r-2}, h'_{r-3}, \ldots, h'_2, h'_1, h'_0)$

| $\leftarrow$ n symbols $\rightarrow$ |

$\oplus [a_{n+2} \otimes (a^0, 0, 0, a^0, a^0, \ldots, a^0, 0, 0, \ldots, 0, 0, 0, 0, 0, 0, 0, 0, 0, h_{r-1}, h_{r-2}, h_{r-3}, \ldots, h_2, h_1, h_0)]$ $$\oplus [a_{n+1} \otimes (0, a^0, 0,0,0, \ldots, 0, 0a^0, a^0, a^0, \ldots, a^0, 0,0,0,$$
$$0 \ldots 0, h'_{r-1}, h'_{r-2}, h'_{r-3}, \ldots, h'_2, h'_1, h'_0)]$$

and $t_j \neq [0000]$ or $[1111]$ for $j=n-1, n-2, n-2 \ldots, n-2*L_{max}$

The system then determines $\alpha^{pO}$ such that $$(c_{n+2}, c_{n+1}, c_n, c_{n+1}, \ldots, c_2 c_1, c_0) = (t_{n+2}, t_{n+1},$$
$$t_n, \ldots t_1, t_1, t_0) \oplus [a_n \otimes (0, 0, a^0, 0, 0, 0, \ldots, 0, 0, a^0, a^0,$$
$$a^0, \ldots, a^0, h''_4, h''_{r-1}, h''_{r-2}, h''_{r-3}, \ldots, h''_2, h''_1,$$
$$h''_0)]$$

and $c_n \neq [000]$ and $[1111]$ for $j=0, 1 \ldots n+2$.

The data code word processor then produces the transmission code word by combining the code word F with the data code word D and appended all-zero symbols.

For decoding, the decoder manipulates the transmission code word C in accordance with the Reed Solomon ECC, to correct errors in the code word. The data symbols $d_{n-1}$ to $d_r$ are then recovered from the error free information symbols of C by removing the code word F.

Section D

This section describes the operations involved in selecting fixed-symbol code words $F_i$ for linear codes in general, that is, for binary linear codes, such as, for example, low density parity check codes. The fixed symbols are then used with the data and associated redundancy information in the manner discussed above.

The fixed-symbol code words are selected based on the underlying linear code. A linear code is described by its parity check matrix, or equivalently by its generator matrix, with the generator matrices of known linear codes typically listed in encoding textbooks. Every code word is a linear combination of the rows of the generator matrix. Accordingly, for information "u," the corresponding code word is $$v = u \otimes G.$$

For an (n,k) systematic code, that is, a code in which the data are unaltered during encoding, the generator matrix includes a k×k identity matrix as a sub-matrix. For a (28,20) code, for example, the generator matrix includes a 20×20 identity matrix as a sub-matrix. All linear codes do not necessarily have "symbols" and may instead have information bit sequences. Thus, a code word of the (n,k) linear code may have k information bits and n-k redundancy bits. While the following discussion assumes a binary code, the techniques can be readily generalized for non-binary linear codes.

The system treats bit sequences of a selected length as "symbols." The selected length is m and preferably m is selected such that k is divisible by m. In the example, k=20 bits and the selected symbol size is m=4. As illustrated in FIG. 3, the generator matrix G can be sub-divided into m×m, or in the example, 4×4, sub-matrices. A sub-divided matrix G' is then formed by adding together the corresponding rows of the 4×4 sub-matrices. Thus, the first rows of the sub-matrices of G' are the sums of the first rows of the corresponding m×m sub-matrices of G.

The matrix G' has $$\frac{n}{m}$$

or $$\frac{28}{4}$$

=7 4×4 sub-matrices, of which $$\frac{k}{m}$$

or $$\frac{20}{4}$$

=5 are identity sub-matrices that correspond to the code word m-bit information "symbols." Assuming that there are a sufficient number of independent rows in G', The m rows of the matrix G' are the fixed-symbol code words $F_0, F_1, \ldots, F_{m-1}$, with the corresponding row of each sub-matrix providing the respective m-bit symbols for each code word. The fixed-symbol code word F that is combined with the data code word is a combination of the fixed-symbol code words $F_0, F_1 \ldots F_{m-1}$ and a selected vector a, with the elements $a_i$ of the vector a selected in the manner discussed above. Thus, the symbols of the transmission code word C are $$c_j = dj + [a_0, a_1, \ldots, a_{m-1}] \otimes G'_j, \text{ for } j=0, 1, \ldots$$
$$k/m-1$$

where $G'_j$ is the corresponding m×m submatrix of G'. The number of fixed-symbol code words required is based on the code length n, as discussed above, and thus, certain $a_i$ may be zero if all m of the fixed-symbol code words are not required.

To ensure that the rows of the matrix G' provide an appropriate number of independent fixed-symbol code words $F_j$, the system calculates the ranks of the respective sub-matrices $G'_j$. Accordingly, the lower the rank, the fewer choices for the various respective symbols of the code words $F_0, F_1$, and so forth. As shown in FIG. 3, the identity sub-matrices each have full rank of R=4. The remaining sub-matrices have ranks of 2 and 3, respectively.

For every m-tuple or m-bit "symbol," there are $2^m$ possible values and in the example there are b=2 prohibited symbols, namely, [0000] and [1111]. Thus, for a given $d_j$ there are at least two excluded values for $f_j$, where $f_j$ is the corresponding symbol of F. If the rank of the corresponding sub-matrix $G_j'$ is less than full, there may also be other excluded values since the possible values for a given code word symbol $f_j$ are combinations of the rows of the corresponding sub-matrix.

For a given sub-matrix $G_j'$ of rank $R_j$, there are $b*2^{m-R_j}$ excluded values. To determine if the sub-matrices $G_j'$ are capable of producing the necessary code words the system produces the sum:

$$S = \sum_{0}^{\frac{n}{m}-1} 2^{m-R_j}$$

and the maximum number of prohibited symbols $b_{max}=(2^m-1)/S$. In the example depicted in FIG. 3, S=11, m=4, and $b_{max}=1$. Thus, the ranks of the sub-matrices of G' depicted in FIG. 3 are not large enough.

To produce sub-matrices of higher rank, the system permutes various rows of G to produce a matrix G" that has associated sub-matrices $G_j''$ with higher ranks. As discussed, the corresponding rows of the m×m sub-matrices of G are combined to produce the respective rows of the m×m sub-matrices of G are combined to produce the respective rows of the m×m sub-matrices $G'_j$. Accordingly, one approach to permuting the rows of G is to determine associated m×m permutation sub-matrices that operate on the various sub-matrices of G. Thus, the system determines an m×m permutation sub-matrix $P_0$ that operates on the sub-matrices that include rows 0 to m−1 of G, a permutation sub-matrix $P_1$ for the sub-matrices that include rows m to 2m−1 of G, and so forth. Preferably, many of the permutation sub-matrices $P_i$ are identity matrices, and thus, the corresponding rows of G are not changed. In the example, the permutation sub-matrices $P_1$, $P_2$, $P_3$ and $P_4$ are identity matrices such that rows 0 to 15 are unchanged, and $$P_s = \begin{bmatrix} 0100 \\ 0001 \\ 0010 \\ 1000 \end{bmatrix}$$

such that rows 16 to 19 of G are permuted and $$G'' = \begin{bmatrix} 1000 & 1000 & 1000 & 1000 & 0100 & 0010 & 1011 \\ 0100 & 0100 & 0100 & 0100 & 0001 & 0100 & 1100 \\ 0010 & 0010 & 0010 & 0010 & 0010 & 1010 & 0110 \\ 0001 & 0001 & 0001 & 0001 & 1000 & 1101 & 0010 \end{bmatrix}$$

Each sub-matrix $G_j''$ then has rank of $R_j=4$, and the code words $F_i$, which are the rows of G″, are an optimal set of code words. Generally, for larger codes and as m increases the ranks of the respective sub-matrices $G_j'$ are equal or at least close to m. Accordingly, the permutation of the rows of G is not typically required for the larger codes.

After determining the code words $F_i$, the system then selects the m-tuples $a_i$ for the elements of the vector a in the manner discussed above. The number of m-tuples that may be tried as values of $a_i$ depends on the ranks of the respective sub-matrices $G'_j$ or $G''_j$. With the rank of each sub-matrix essentially equal to m or m−1, the number of m-tuples is between n/m and 2*(n/m). The maximum number of m-tuples to try is then b*2*(n/m), where b is the number of prohibited symbols. Accordingly, a small subset of the possible $2^m$ values is tried.

One approach is to select a non-zero m-tuple as essentially a seed value and use an arbitrary shift register or other random number generator to produce the desired number of m-tuples. Thus, the system may use a linear feedback shift register to shift some number of times to produce a next m-tuple, and so forth. The shift register may, for example, shift x*S+1 times to produce the respective trial values. The system then tests the appropriate number of values $a_i$ and substitutes new trial values as necessary.

For a non-systematic (n,k) code, that is, a code that alters the data during encoding, the k×n generator matrix G has rank k and there are non-singular row and column permutation matrices such that

PGQ=G* where P is a row permutation matrix, Q is a column permutation matrix and G* includes a k×k identity sub-matrix. The permuting of the rows changes the systematic code within the same code space, while the permuting of the columns transforms the code into a non-systematic code. The matrix G* is then sub-divided into m×m sub-matrices, and the fixed code words $F_0$, $F_1$, … $F_{m-1}$ are obtained after re-transforming the code, that is, by combining the corresponding rows of the m×m sub-matrices of $(G*)(Q^{-1})$, to produce sub-matrices $G_j'$.

If the permutation of the rows of G or $(G*)(Q^{-1})$ does not produce full rank sub-matrices $G_j'$ in the manner discussed above, the system may determine a full rank sub-matrix s for a given m×m matrix A by finding all possible solutions for the matrix equation xA=s and selecting the solution with the highest rank. First, using row operations only, determine PA=Z, where Z has k non-zero rows and m−k all zero rows. Using column operations only, i.e., a column permutation matrix Q, reduce Z to the canonical form:

$$PAQ = ZQ = \left[ \begin{array}{c|c} I_{k \times k} & B \\ \hline 0_{(m-k) \times k} & 0_{(m-k) \times (m-k)} \end{array} \right]$$

where $I_{k \times k}$ is a k×k identify matrix and $O_{r \times s}$ is an r×s matrix with all zero elements. To solve xA=s, first try to solve yPAQ=c $$y \left[ \begin{array}{c|c} I_{k \times k} & B \\ \hline 0_{(m-k) \times k} & 0_{(m-k) \times (m-k)} \end{array} \right] =$$

$$[y_1, y_2] * \left[ \begin{array}{c|c} I_{k \times k} & B \\ \hline 0_{(m-k) \times k} & 0_{(m-k) \times (m-k)} \end{array} \right] = [y_1, y_1 * B] = [c_1, c_2]$$

where $y_1$ is a 1×k matrix and $y_2=1\times(m-k)$ matrix. Check if $c_1*B=c_2$ and if so, one solution is $x_0=[c_1, c_2]*P$. Further, calculating c=sQ=[c1, c2] and $c_1*B=c_2$, all solutions are of the form $x_1=x_0+[O,z]*P$, where z is any 1×(m-r) row matrix and there are therefore $2^{(m-r)}$ solutions.

We have depicted that system as including a plurality of processors, such as the data manipulation processor and the selection processor. The processors may be combined into a single processor or arranged as various other groupings of processors. The instructions for the operations that the processors perform may be stored on memory resident on the respective processors, or on memory that is resident on certain of the processors and shared with or made available to other processors. Alternatively, the instructions for one or more of the operations may be made available to or communicated to the processors by, for example, a system controller (not shown).

The system is readily implemented by means of one or more digital processors, either general purpose or special purpose. Conventional data processing software and algorithms are readily applied to perform the requisite processing described herein.

What is claimed is:

1. A method of encoding data including the steps of:
   A. manipulating the data to include one or more additional predetermined m-tuples;
   B. determining a set of one or more prohibited m-tuples that combine with respective m-tuples of the data and the predetermined m-tuples to produce m-tuples that do not meet modulation requirements; and
   C. selecting one or more m-tuples that are not prohibited m-tuples and combining the selected one or more m-tuples with the data and the predetermined m-tuples to produce a sequence of m-tuples that meet the modulation requirements.

2. The method of claim 1 wherein the step of selecting includes selecting m-tuples that combine with one or more fixed sequences of m-tuples to produce selected m-tuples that combine with the data and predetermined m-tuples.

3. The method of claim 2 wherein
the step of manipulating the data includes manipulating the data in accordance with a shortened distance d (n,k) Reed Solomon code to produce a data code word that includes n-k=r m-bit redundancy symbols and appending to the data code word the one or more predetermined m-tuples,
the step of determining includes
determining one or more fixed-symbol code words $F_i$ with selected non-zero symbols, and
the step of selecting includes selecting for each fixed-symbol code word a corresponding m-tuple $\alpha^{pi}$ such that the fixed symbols are multiplied by the corresponding $\alpha^{pi}$, and the results are combined with the data code word and the appended predetermined m-tuples to produce a corresponding transmission code word in which the respective symbols meet the modulation requirements.

4. The method of claim 3 wherein
the determining step further includes determining the number of fixed-symbol code words based on the code length and the modulation requirements, and
the manipulation step further includes appending to the data code word a number of predetermined m-tuples that corresponds to the number of fixed-symbol code words.

5. The method of claim 4 wherein the predetermined m-tuples are all set to the value $\alpha^0$ and the corresponding symbols in the transmission code word have values that correspond to the selected $\alpha^{pi}$.

6. The method of claim 4 wherein the step of determining includes determining fixed-symbol code words in which the fixed symbols are combinations of corresponding rows in m×m sub-matrices of the k×n code generator matrix G.

7. The method of claim 6 wherein the step of determining further includes for a non-systematic code manipulating the code generator matrix G by permuting rows with a row permutation matrix P and permuting columns with a column permutation matrix Q to produce a generator matrix G* for an associated systematic code as PGQ and determining the fixed symbols of the fixed-symbol code words as combinations of corresponding rows in m×m sub-matrices of the matrix $G^*Q^{-1}$.

8. A method of encoding data symbols including the steps of
A. manipulating the data symbols in accordance with a shortened distance d (n,k) Reed Solomon code to produce r redundancy symbols and including the data symbols, the redundancy symbols and one or more predetermined appended symbols in a data code word D;
B. selecting one or more symbols $\alpha^{pi}$ to combine with one or more fixed-symbol code words $F_i$ to produce a code word $F=\alpha^{pm}F_m+\alpha^{pm-1}F_{m-1}+ \ldots +\alpha^{p0}F_0$ that when combined with the data code word produces a transmission code word that includes respective symbols that meet modulation requirements; and
C. combining the data code word D and the selected code word F to produce a transmission code word C with respective symbols that meet the modulation requirements.

9. The method of claim 8 wherein the step of selecting includes
determining a number of fixed-symbol code words required based on the code length and the number of symbols prohibited by the modulation requirements,
for all but one of the respective fixed-symbol code words setting to $\alpha^0$ L information symbols that combine with L corresponding symbols of the data and setting the remaining information symbols that correspond to the data to all zeros and for the one code word setting to $\alpha^0$ L-r information symbols that combine with L-r corresponding symbols of the data and a first redundancy symbol, and setting the remaining information symbols that correspond to the data to all zeros, and
selecting for each fixed-symbol code word $F_i$ a symbol $\alpha^{pi}$ such that the non-zero symbols of the respective code words combine with the corresponding symbols of the data code word to produce corresponding symbols of the transmission code word.

10. A method of encoding data symbols including the steps of
A. appending a predetermined m-tuple to L m-tuples of data;
B. determining a set of one or more prohibited m-tuples that combine with respective m-tuples of the data and the predetermined m-tuple to produce m-tuples that do not meet modulation requirements; and
C. selecting one or more m-tuples that are not prohibited m-tuples and combining the selected one or more m-tuples with the L data m-tuples and the predetermined m-tuple to produce L+1 m-tuples that meet the modulation requirements.

11. The method of claim 10 wherein the step of selecting includes selecting a single m-tuple that combines with respective data m-tuples and the predetermined m-tuple.

12. The method of claim 10 wherein the step of selecting includes selecting an m-tuple that combines with a sequence of L+1 fixed m-tuples to produce L+1 selected m-tuples that combine with the data and predetermined m-tuple.

* * * * *